United States Patent
Kim et al.

(10) Patent No.: US 9,543,332 B2
(45) Date of Patent: Jan. 10, 2017

(54) ARRAY SUBSTRATE, DISPLAY PANEL AND DISPLAY DEVICE

(71) Applicant: BOE Technology Group Co., Ltd., Beijing (CN)

(72) Inventors: Heecheol Kim, Beijing (CN); Song-Young- Suk, Beijing (CN); Yoo-Seong- Yeol, Beijing (CN); Choi-Seung- Jin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/478,514

(22) Filed: Sep. 5, 2014

(65) Prior Publication Data

US 2015/0364493 A1  Dec. 17, 2015

(30) Foreign Application Priority Data

Jun. 13, 2014  (CN) .......................... 2014 1 0264250

(51) Int. Cl.
*H01L 27/12* (2006.01)
*H01L 23/538* (2006.01)
*G02F 1/1362* (2006.01)
*G02F 1/1345* (2006.01)

(52) U.S. Cl.
CPC ........... *H01L 27/124* (2013.01); *G02F 1/1345* (2013.01); *G02F 1/13458* (2013.01); *G02F 1/136286* (2013.01); *H01L 23/5387* (2013.01); *H01L 27/1218* (2013.01); *H01L 2924/0002* (2013.01)

(58) Field of Classification Search
CPC .......................... H01L 27/124; H01L 27/1218
USPC .......................................................... 257/773
See application file for complete search history.

(56) References Cited

U.S. PATENT DOCUMENTS

| | | | |
|---|---|---|---|
| 5,759,047 A * | 6/1998 | Brodsky | H01L 23/49811 439/66 |
| 6,507,113 B1 * | 1/2003 | Fillion | H01L 23/49811 257/40 |
| 7,482,541 B2 | 1/2009 | Ito | |
| 2001/0010469 A1 * | 8/2001 | Fukasawa | G01R 31/2886 324/750.29 |
| 2012/0146210 A1 * | 6/2012 | Oganesian | H01L 21/76898 257/723 |
| 2012/0193803 A1 * | 8/2012 | Yoshino | H01L 23/36 257/773 |

(Continued)

FOREIGN PATENT DOCUMENTS

CN  1529198 A  9/2004
CN  100520539 C  7/2009
(Continued)

OTHER PUBLICATIONS

Second Office Action for Chinese Patent Application No. 201410264250.6, dated Jun. 13, 2016, 8 pages.
(Continued)

*Primary Examiner* — Kenneth Parker
*Assistant Examiner* — Warren H Kilpatrick
(74) *Attorney, Agent, or Firm* — Westman, Champlin & Koehler, P.A.

(57) ABSTRACT

An array substrate comprises: a plurality of flexible cushions; and a plurality of signal lines, wherein the signal lines have ends respectively located on the flexible cushions.

9 Claims, 2 Drawing Sheets

(56) References Cited

U.S. PATENT DOCUMENTS

2015/0001566 A1\* 1/2015 Barchmann .............. H05K 1/02
257/98

FOREIGN PATENT DOCUMENTS

JP 10-170960 A 6/1998
KR 10-2008-0001330 A 1/2008

OTHER PUBLICATIONS

First Office Action, including Search Report, for Chinese Patent Application No. 201410264250.6, dated Mar. 28, 2016, 7 pages.
Rejection Decision for Chinese Patent Application No. 201410264250.6, dated Aug. 26, 2016, 11 pages.

\* cited by examiner

ARRAY SUBSTRATE, DISPLAY PANEL AND DISPLAY DEVICE

CROSS-REFERENCE TO RELATED APPLICATION

This application claims the benefit of Chinese Patent Application No. 201410264250.6 filed on Jun. 13, 2014 in the State Intellectual Property Office of China, the whole disclosure of which is incorporated herein by reference.

BACKGROUND OF THE INVENTION

1. Field of the Invention

Embodiments of the present invention relate to the field of display technology, and particularly to an array substrate, a display panel and a display device.

2. Description of the Related Art

In a display device such as a liquid crystal display device, as shown in FIG. 1, bonding pads 11 are formed at ends of signal lines 1 in an array substrate. As shown in FIG. 2, electrodes 21 of a flexible circuit board chip on flex (COF) 2 are connected to the bonding pads 11 through an anisotropic conductive film (ACF) 3. There are conductive particles in the anisotropic conductive film 3. The electrodes 21 are electrically connected to the bonding pads 11 through the conductive particles in the anisotropic conductive film 3. In order to ensure that there is no short-circuit between the adjacent bonding pads 11, the number of the conductive particles in the anisotropic conductive film 3 is limited, and thus a width of the bonding pads 11 needs to be larger, thereby ensuring a certain resistance while effective electric connections are formed between the electrodes 21 and the bonding pads 11.

However, the more the width of the bonding pads 11 is, the more the pitch among the signal lines 1 is, so that utilization ratio of the space is reduced against the narrow-frame requirement of the display device.

SUMMARY OF THE INVENTION

The object of the embodiment of the present invention is to provide an array substrate, a display panel and a display device which can ensure effective electric connections between a flexible circuit board and signal lines while maintaining a smaller pitch among the signal lines.

According to embodiments of the present invention, there is provided an array substrate, comprising:
a plurality of flexible cushions; and
a plurality of signal lines, wherein the signal lines have ends respectively located on the flexible cushions.

According to embodiments of the present invention, there is provided a display panel, comprising: the above-mentioned array substrate; a flexible circuit board disposed in the array substrate, wherein the flexible circuit board is provided with a plurality of electrodes corresponding to the ends of the signal lines, and wherein the ends of the signal lines in the array substrate are respectively located between the flexible cushions and the electrodes such that the ends of the signal lines are respectively electrically connected to the electrodes.

According to embodiments of the present invention, there is provided a display device comprising the above-mentioned display panel.

DETAILED DESCRIPTION OF THE EMBODIMENTS

Figure 1:
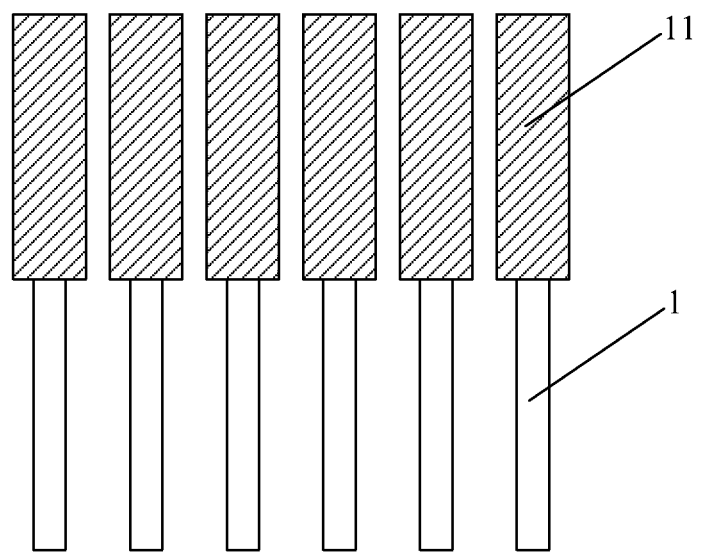
FIG. 1 is a schematic view showing conventional structures of signal lines and bonding pads.
Figure 2:
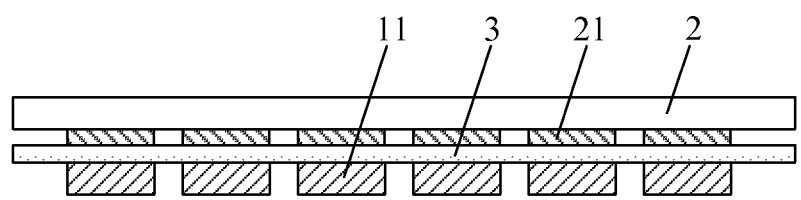
FIG. 2 is a schematic view showing conventional structures of the signal lines and bonding pads when the flexible circuit board is connected to the bonding pads.

A further description of the invention will be made in detail as below with reference to embodiments of the present invention taken in conjunction with the accompanying drawings. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

According to a general concept of the present invention, there is provided an array substrate, comprising:
a plurality of flexible cushions; and
a plurality of signal lines, wherein the signal lines have ends respectively located on the flexible cushions.

According to an general concept of the present invention, there is provided a display panel, comprising: the above-mentioned array substrate; a flexible circuit board disposed in the array substrate, wherein the flexible circuit board is provided with a plurality of electrodes corresponding to the ends of the signal lines, and wherein the ends of the signal lines in the array substrate are respectively located between the flexible cushions and the electrodes such that the ends of the signal lines are respectively electrically connected to the electrodes.

According to a general concept of the present invention, there is provided a display device comprising the above-mentioned display panel.

According to the embodiments of the present invention, it is not necessary to connect the flexible circuit board with the signal lines through the anisotropic conductive film. Instead, the flexible cushions are respectively disposed under the ends of the signal lines, in this way, the flexible circuit board can be placed directly on the array substrate such that the electrodes of the flexible circuit board are in direct contact with the ends of the signal lines for achieving electric connection. Effective electric connection between the flexible circuit board and the signal lines can be ensured while smaller pitch among the signal lines is maintained. As a result, utilization ratio of the space in the display device can be improved to facilitate design of the narrow frame of the display device.

A further description of the invention will be made in detail as below with reference to embodiments of the present invention taken in conjunction with the accompanying drawings. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 3:
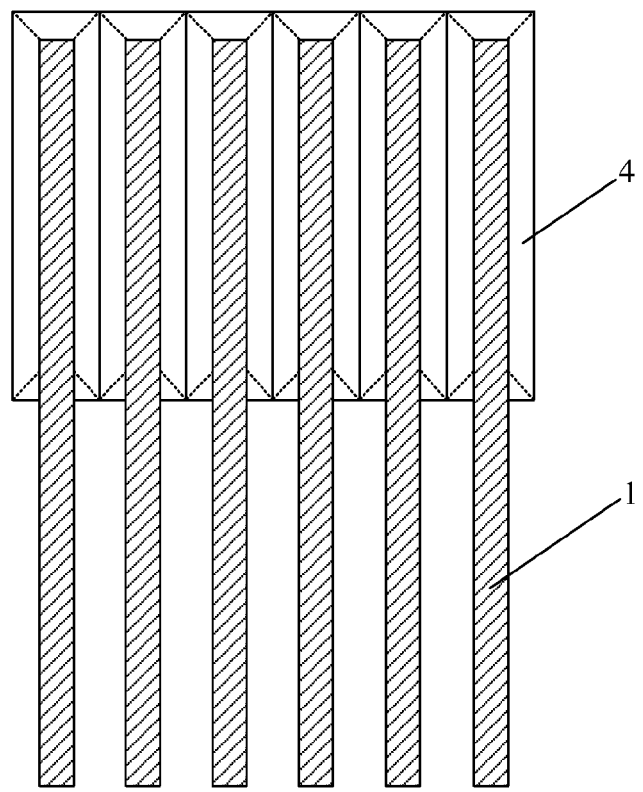
FIG. 3 is a schematic view showing structures of signal lines and flexible cushions according to an embodiment of the present invention.
Figure 4:
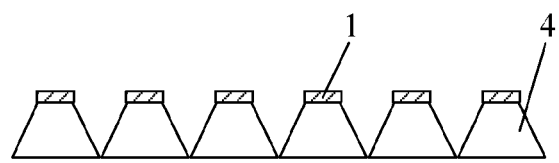
FIG. 4 is a schematic section view of the signal lines and the flexible cushions shown in FIG. 3.

As shown in FIGS. 3 and 4, in the embodiment, an array substrate comprises a plurality of signal lines 1 and a plurality of flexible cushions 4. The signal lines 1 have ends respectively located on the flexible cushions 4.

Figure 5:
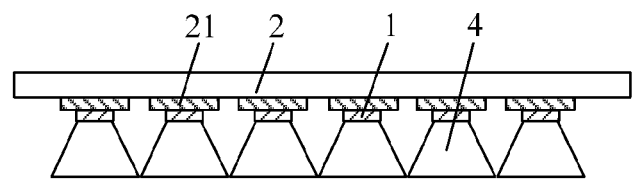
FIG. 5 is a schematic view showing structures of the signal lines and the flexible cushions shown in FIG. 3 when the flexible circuit board is connected to the signal lines.

In the embodiment, a flexible circuit board can be connected to the array substrate. Signals are supplied to the signal lines 1 through the flexible circuit board. As shown in FIG. 5, the flexible circuit board 2 is placed on the plurality of flexible cushions 4. A plurality of electrodes 21 on a bottom surface of the flexible circuit board 2 are in one-to-one correspondence with the plurality of flexible cushions 4. In this way, the electrodes 21 are in direct contact with the ends of the signal lines 1 respectively, so that the flexible circuit board 2 is connected to the array substrate. Since it is not necessary to connect the flexible circuit board 2 with the signal lines 1 through the anisotropic conductive film, and electric conductivity of the direct contact connection itself is good, it is not necessary to increase width of the ends of the signal lines 1. Even if the width of the ends of the signal lines 1 needs to be slightly increased to ensure effectiveness of the electric connection, it is not necessary to increase the pitch among the plurality of signal lines 1 since the adjacent electrodes 21 are insulated from each other.

With the array substrate according to the present embodiment, it is not necessary to connect the flexible circuit board with the signal lines through the anisotropic conductive film. Instead the flexible cushions are respectively disposed under the ends of the signal lines, in this way, the flexible circuit board can be placed directly on the array substrate such that the electrodes of the flexible circuit board are in direct contact with the ends of the signal lines for achieving electric connection. Effective electric connection between the flexible circuit board and the signal lines can be ensured while smaller pitch among the signal lines is maintained. As a result, utilization ratio of the space in the display device can be improved to facilitate design of the narrow frame of the display device.

In some embodiments, the array substrate further comprises a substrate. The flexible cushions 4 are disposed between the ends of the signal lines 1 and the substrate, respectively.

In some embodiments, the flexible cushions 4 are elongated, and extend in the same direction as the ends of the signal lines 1, respectively. Top surfaces of the flexible cushions 4 may have substantially the same width as that of the ends of the signal lines 1.

In some embodiments, each flexible cushion 4 may be made of resin.

In some embodiments, each flexible cushion 4 has a sectional area in a horizontal section, and the sectional area is gradually decreased from above downwards. In some embodiments, each flexible cushion 4 has a less width on the signal line side than on the opposite side. For example, each flexible cushion 4 has a substantially trapezoidal cross section and has a less width on the signal line side than on the opposite side. In some embodiments, the signal line 1 has the end and a remaining portion extending from the end. An end, on the remaining portion side, of the flexible cushion 4 has an inclined end surface. The inclined end surface is inclined away from the signal line 1 in a direction in which the remaining portion extends. Furthermore, in some embodiments, the other end of each flexible cushion 4 also has an inclined end surface.

In some embodiments, the plurality of signal lines 1 may comprise gate lines or data lines.

In accordance with an embodiment of the present invention, there is also provided a display panel, comprising: the above-mentioned array substrate; and a flexible circuit board 2 disposed above the plurality of flexible cushions 4 in the array substrate, as shown in FIG. 5. A plurality of electrodes 21 in one-to-one correspondence with the plurality of flexible cushions 4 is disposed on a bottom surface of the flexible circuit board 2. The ends of the signal lines 1 in the array substrate are respectively located between the flexible cushions 4 and the electrodes 21 such that the ends of the signal lines 1 are respectively electrically connected to the electrodes 21.

The specific process and principle of the connection between the array substrate and the flexible circuit board are the same as those in the above embodiment and are no longer described for the sake of brevity.

With the display panel according to the present embodiment, it is not necessary to connect the flexible circuit board with the signal lines through the anisotropic conductive film. Instead, the flexible cushions are respectively disposed under the ends of the signal lines, in this way, the flexible circuit board can be placed directly on the array substrate such that the electrodes of the flexible circuit board are in direct contact with the ends of the signal lines for achieving electric connection. Effective electric connection between the flexible circuit board and the signal lines can be ensured while smaller pitch among the signal lines is maintained. As a result, utilization ratio of the space in the display device can be improved to facilitate design of the narrow frame of the display device.

In accordance with an embodiment of the present invention, there is also provided a display device comprising the above-mentioned display panel.

The specific structure and principle of the display panel are the same as those in the above embodiment and are no longer described for the sake of brevity. Specifically, the display device may comprise a liquid crystal panel, a liquid crystal TV, a liquid crystal display, a digital frame, a mobile phone, and the like.

With the display device according to the present embodiment, it is not necessary to connect the flexible circuit board with the signal lines through the anisotropic conductive film. Instead, the flexible cushions are respectively disposed under the ends of the signal lines, in this way, the flexible circuit board can be placed directly on the array substrate such that the electrodes of the flexible circuit board are in direct contact with the ends of the signal lines for achieving electric connection. Effective electric connection between the flexible circuit board and the signal lines can be ensured while smaller pitch among the signal lines is maintained. As a result, utilization ratio of the space in the display device can be improved to facilitate design of the narrow frame of the display device.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

The invention claimed is:

1. An array substrate, comprising:
a plurality of flexible cushions; and
a plurality of signal lines, wherein the signal lines have ends respectively located on the flexible cushions, wherein:
the flexible cushions and the ends of the signal lines extend substantially in a straight-line shape in a first direction, respectively; and each of the flexible cushions has a substantially trapezoidal cross section in a second direction that is substantially perpendicular to the first direction, and has a less width on a side in contact with the signal line than on an opposite side to the side.

2. The array substrate of claim 1, further comprising:
a substrate, wherein the flexible cushions are disposed between the ends of the signal lines and the substrate, respectively.

3. The array substrate of claim 1, wherein:
the ends of the signal lines are configured to be in direct contact with electrodes of a flexible circuit board.

4. The array substrate of claim 1, wherein:
top surfaces of the flexible cushions have substantially the same width as that of the ends of the signal lines.

5. The array substrate of claim 1, wherein:
each of the flexible cushions is made of resin.

6. The array substrate of claim 1, wherein:
the signal line further has a remaining portion extending from the end, and, an end, on the remaining portion side, of the flexible cushion has an inclined end surface inclined away from the signal line in a direction in which the remaining portion extends.

7. The array substrate of claim 1, wherein:
the plurality of signal lines comprise any of gate lines and data lines.

8. A display panel, comprising:
the array substrate according to claim 1;
a flexible circuit board disposed in the array substrate, wherein the flexible circuit board is provided with a plurality of electrodes corresponding to the ends of the signal lines; and
wherein the ends of the signal lines in the array substrate are respectively located between the flexible cushions and the electrodes such that the ends of the signal lines are electrically connected to the electrodes, respectively.

9. A display device, comprising the display panel according to claim 8.

* * * * *